(12) United States Patent
Quinn et al.

(10) Patent No.: US 7,786,916 B2
(45) Date of Patent: Aug. 31, 2010

(54) DIGITAL TO ANALOG CONVERTER CIRCUITS AND METHODS OF OPERATION THEREOF

(75) Inventors: Simon Kenneth Quinn, Edinburgh (GB); Andrew James Howlett, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 0 days.

(21) Appl. No.: 12/203,542

(22) Filed: Sep. 3, 2008

(65) Prior Publication Data

US 2009/0066552 A1    Mar. 12, 2009

(30) Foreign Application Priority Data

Sep. 6, 2007    (GB)    ................... 0717320.6

(51) Int. Cl.
*H03M 1/66*    (2006.01)
(52) U.S. Cl. .................... 341/150; 341/144
(58) Field of Classification Search ............... 341/153, 341/136, 144, 150
See application file for complete search history.

(56) References Cited

U.S. PATENT DOCUMENTS

| 5,332,997 | A * | 7/1994 | Dingwall et al. ............ 341/150 |
| 6,323,798 | B1 * | 11/2001 | Abe ............................. 341/150 |
| 6,573,850 | B1 | 6/2003 | Pennock et al. |
| 6,952,176 | B2 | 10/2005 | Frith et al. |
| 7,102,557 | B1 | 9/2006 | Frith et al. |
| 7,352,314 | B2 * | 4/2008 | Horibata ........................ 341/150 |
| 2005/0285768 | A1 | 12/2005 | Hagiwara et al. |
| 2007/0052568 | A1 | 3/2007 | Horibata |

FOREIGN PATENT DOCUMENTS

EP    0 899 884    3/1999

OTHER PUBLICATIONS

Ichiro Fujimori, "A Multibit Delta-Sigma Audio DAC with 120-dB Dynamic Range" IEEE Journal of Solid State Circuits, vol. 35, No. 8, pp. 1066-1073 (Aug. 2000).

* cited by examiner

*Primary Examiner*—Brian Young
(74) *Attorney, Agent, or Firm*—Dickstein Shapiro LLP (57) ABSTRACT

A multi-bit digital to analog converter is implemented by a switched-capacitor arrangement in which a reservoir capacitor (Cf) accumulates charge representing the desired analog output signal (Vout+/Vout−). An array of further capacitors (C0-CN) correspond in number at least to the number of data bits (D0-DN) to be converted. The capacitors (Cf, C0-CN) are selectively interconnected with one another and with reference voltage sources (Vmid, Vdd, Vss) in a repetitive sequence of phases including (i) a sampling phase (P2) in which the further capacitors are connected (S3, S4) to reference voltages selected in accordance with the values of the data bits, (ii) an equalization phase (P6a) in which the further capacitors are connected (S2) in parallel with one another without connecting them in parallel with the first capacitor, followed by (iii) a transfer phase (P6b) in which the parallel connected further capacitors are connected (S1, S5) in parallel with the first capacitor. The equalization phase masks nonlinearities arising in switches (S2) and thereby improves harmonic distortion.

33 Claims, 7 Drawing Sheets

DIGITAL TO ANALOG CONVERTER CIRCUITS AND METHODS OF OPERATION THEREOF

BACKGROUND OF THE INVENTION

1. Field of the Invention

The invention relates to digital to analog converter circuits, particularly multi-bit DACs of the switched capacitor type and methods of operating the same.

2. Description of the Related Art

Digital to analog converters or DACs are a key component of many electronic apparatuses, being the point at which signals represented digitally for storage, transmission and processing are converted into analog signals for driving a loudspeaker, display element or actuator in the 'real world'. One type of DAC which is attractive for integration with digital electronics on a single chip is the switched-capacitor DAC. The principles of operation of these DACs are explained in the specific description below.

As with any part of the signal chain, deviations from the ideal behavior in the DAC can introduce both random noise and harmonic distortion. In designing a switched capacitor DAC for extreme high-fidelity applications, the inventors have found that some steps taken to improve noise performance and dynamic range reveal and exacerbate sources of harmonic distortion, limiting overall performance.

SUMMARY OF THE INVENTION

It is an object of the invention to enable the provision of an improved DAC, in particular by reducing harmonic distortion without a corresponding increase in other types of error.

The invention provides a digital to analog converter circuit (DAC) having inputs for a plurality of digital data bits and at least one output for an analog signal, the DAC comprising:

- a first capacitor for accumulating charge representing the desired analog output signal;
- an amplifier for generating the analog signal in response to voltage on said first capacitor;
- an array of further capacitors corresponding in number at least to the number of the data bits; and
- a network of switches operable in a first state which connects at least a subset of the further capacitors to sources of reference voltage selected in accordance with values of the data bits, in a second state which connects the further capacitors in parallel with one another without connecting them in parallel with the first capacitor and in a third state which connects the further capacitors in parallel with one another and to the first capacitor.

The first and third states may be employed to implement a sampling phase and a transfer phase respectively, as in known switched capacitor circuits. The provision of the second state enable an intermediate phase to be implemented, for equalization of charge across the element capacitors to occur while masking non-linear aspects of the equalization process from the DAC output. The invention thus enables an improved combination of high signal-to-noise ratio and low total harmonic distortion.

Preferably, the DAC further comprises a sequencer for controlling the switches to implement repeatedly a cycle of the first, second and third states in that order.

The sequencer is preferably arranged to make the first and third states last at least twice as long as the second state. In a preferred embodiment, the second state has less than an eighth, for example one tenth the duration of the first and third states. The sequencer is preferably arranged to control the switches to implement a guard state of short duration in the course of transitions between the first and third states, the further capacitors being isolated from both reference voltages and the first capacitor during the guard state.

The use of guard states ensures an orderly transition between states by preventing, for example, signal leakage and short circuits.

Each of the further capacitors typically has a first terminal and a second terminal.

In one embodiment, each of the further capacitors has its first terminal connected to a first common node, and the network of switches includes switches operable to connect the common node in the first state to a reference voltage and in the third state to a first terminal of the first capacitor.

The network of switches may suitably comprise an array of switches operable to connect the second terminals of the further capacitors to a second common node, and a further switch connected between the common node and a (second) terminal of the first capacitor.

The further switch may comprise a transmission gate in which a PMOS transistor is not more than twice the area of an NMOS transistor in the same transmission gate.

In a preferred embodiment, each switch of the network comprises at least one MOS transistor.

Some switches of the network may comprise MOS transmission gates made of both NMOS and PMOS transistors while other switches comprise only NMOS or only PMOS transistors, and in this case it is preferred that the PMOS transistor of at least one of the transmission gates has approximately three times the area of the NMOS transistor, and dummy NMOS transistors are provided to equalize gate area on the PMOS and NMOS transistors. This assists in matching the impedance of the switching elements, and in minimizing charge injection from clock control signals.

In one embodiment, the DAC further comprises a duplicate set of capacitors and switch network for generating a complementary analog output signal from complementary digital data bits representing the negative of the value represented by the digital data bits, the two analog signals in use forming a differential output signal.

The DAC may optionally comprise pre-processing means for receiving a sequence of input digital data samples at an input sample rate and for generating intermediate digital data samples comprising the digital data bits at a higher sample rate.

The intermediate digital data samples will typically have fewer bits than the input digital data samples. Noise shaping algorithms optionally with feedback (sigma-delta conversion) allow a 24-bit signal to be converted using a 5- or 6-bit DAC and 128-time oversampling.

The DAC may further comprise a low pass filter having a cut-off frequency between the input sample rate and that of the intermediate digital data. Low pass filter in this context is intended to include a band pass filter having a lower cut-off frequency as well as an upper one.

The invention also provides an integrated circuit product comprising a DAC circuit as defined above together with a decoder for deriving the data bits from stored signal data.

In a preferred implementation, the decoder is for audio data and two or more DACs are provided to generate analog output signals for respective audio channels in the digital audio data.

Further, the present invention provides digital audio apparatus comprising a source of digital audio data, a switched capacitor digital to analog converter as defined above, and an analog audio amplifier, the amplifier being connected to be driven by an analog signal generated by the DAC in response to the digital audio data.

The source of digital audio data may typically comprise a reader for digital audio data stored in a storage medium. This medium may be an optical disc (CD, DVD etc.), magnetic hard disc or solid state memory.

From a further aspect, the present invention provides a method of converting plural bits of digital data into an analog output signal, the method comprising:

providing a first capacitor for accumulating charge representing the desired analog output signal;

providing an array of further capacitors corresponding in number at least to the number of the data bits;

selectively interconnecting the capacitors with one another and with reference voltage sources in a repetitive sequence of phases including (i) a first phase in which the further capacitors are connected to reference voltages selected in accordance with the values of the data bits so as to accumulate samples of charge representing values of the digital data bits, (ii) an equalization phase in which the further capacitors are connected in parallel with one another without connecting them in parallel with the first capacitor, followed by (iii) a transfer phase in which the parallel connected further capacitors are connected in parallel with the first capacitor; and generating the analog signal in response to voltage on the first capacitor.

The selective interconnection is preferably performed using a network of switches and a sequencer for controlling the switches to implement repeatedly a cycle of the sample, equalization and transfer phases, in that order.

Preferably the sample and transfer phases each last at least twice as long as the equalization phase.

The repetitive sequence of phases preferably further includes guard states of short duration in the course of transitions to and from the sample phase, the further capacitors being isolated from any reference voltage and from the first capacitor during the guard state.

Each of the further capacitors typically has a first terminal and a second terminal.

Preferably, each of the further capacitors has its first terminal connected to a first common node, and switches are provided to connect the common node in the sample phase to a reference voltage and in the transfer phase to the first terminal of the first capacitor.

In preferred embodiments of the method, an array of switches is used to connect the second terminals of the further capacitors to a (second) common node in the equalization and transfer phases, and a further switch is used to connect the (second) common node to a (second) terminal of the first capacitor to implement the transfer phase.

The further switch may suitably comprise a transmission gate in which a PMOS transistor is not more than twice the area of an NMOS transistor in the same transmission gate.

One embodiment of the method further comprises providing a duplicate set of capacitors and generating a complementary analog output signal from complementary digital data bits representing the negative of the value represented by the digital data bits, the two analog signals in use forming a differential output signal.

The method may further comprise:

receiving a sequence of input digital data samples at an input sample rate; and pre-processing the input digital samples to generate intermediate digital data samples at a higher sample rate, the intermediate digital data samples defining the digital data bits for the digital to analog conversion.

The intermediate digital data samples preferably have fewer bits than the input digital data samples.

Preferably the analog output signal is filtered with a low-pass cut-off frequency between the input sample rate and that of the intermediate digital data.

The method may comprise the additional step of decoding the data bits from stored signal data.

In one application of the invention, the data is audio data and two or more streams of digital data are converted by the method to generate analog output signals for respective audio channels in the digital audio data.

BRIEF DESCRIPTION OF THE DRAWINGS

Embodiments of the invention will now be described, by way of example only, by reference to the accompanying drawings, in which:

FIG. 2b shows more detail of certain switches represented by blocks in FIG. 2a;

DETAILED DESCRIPTION OF THE PREFERRED EMBODIMENTS

Figure 1:
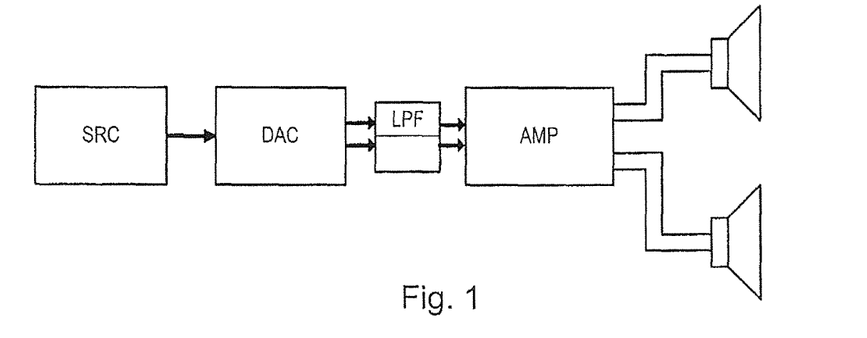
FIG. 1 is a block schematic diagram of an audio reproduction apparatus, in which a digital-to-analog (DAC) converter according to the invention is used.

FIG. 1 shows an examplary system in which a digital to analog converter (DAC) according to the present invention can be employed. Here digital data from a source SRC such as a CD player or digital broadcast receiver is converted by the DAC to an analog signal which is filtered (LPF) before being amplified (AMP) and sent to stereo speakers, headphones or the like. The novel circuit to be described below is an analog switched capacitor filter of a Sigma-Delta DAC with 24-bit resolution of digital input data. achieving >120 dB SNR (signal-to-noise ratio), Such high SNR figures are increasingly required for high-end Hi-Fi applications. Of course, a stereo implementation is mentioned as one example only, and the same techniques can be applied in multi-channel or mono applications.

The principles of the novel DAC allow increased signal quality, represented by lower THD (total harmonic distortion), without compromising the design strategy used to achieve a high SNR. These principles are equally applicable to improving the signal quality in lower cost applications, and in non-audio applications as well, and it should be appreciated that the application is mentioned as one example only. Depending on the application and implementation desired, the DAC may be integrated with one or both of the source circuitry SRC and the output amplifier AMP.

Figure 2A:
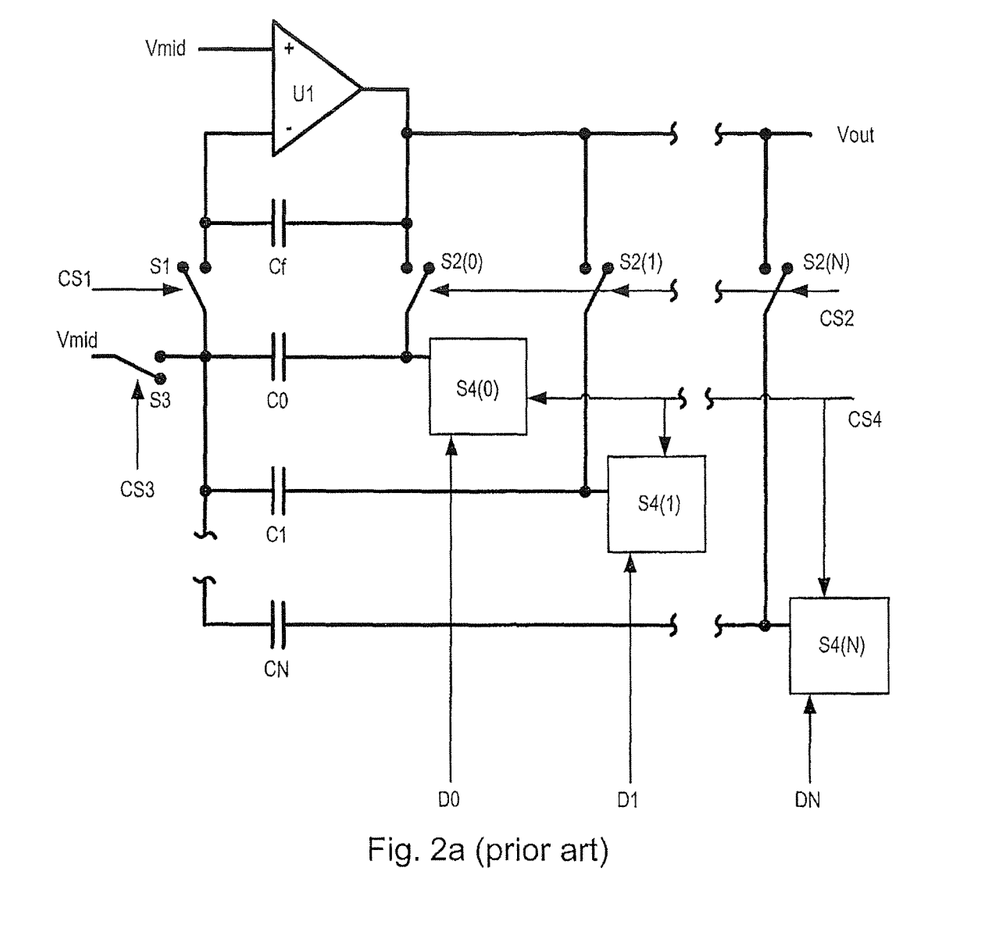
FIG. 2a shows the basic architecture of a known switched capacitor DAC.
Figure 2B:
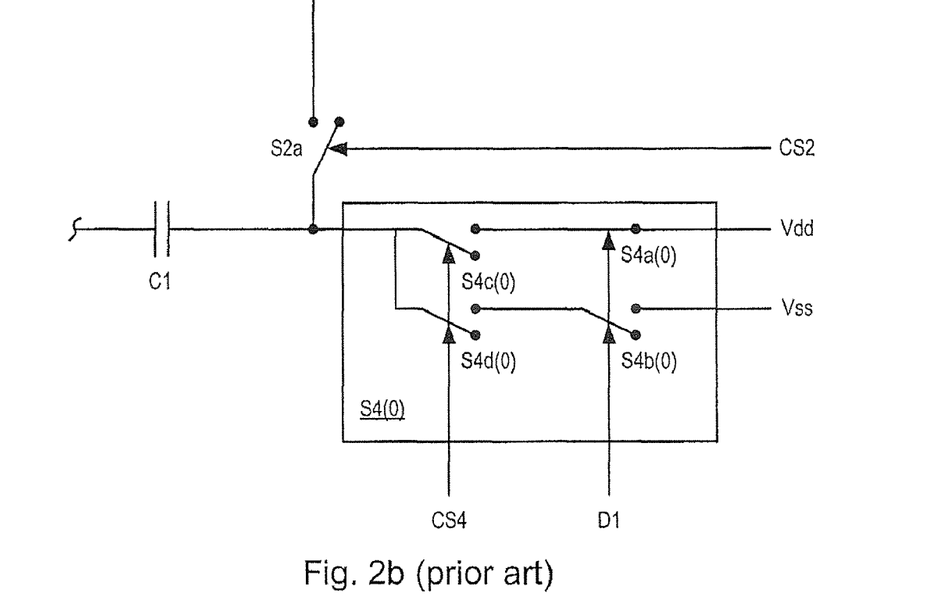

FIG. 2a shows the basic architecture of the analog section of a DAC implemented by a known switched-capacitor technique, while FIG. 2b shows the structure of switch blocks S4(0) etc. The circuit is based around an operational amplifier (op-amp) U1, having a non-inverting input connected to a reference voltage Vmid and an output generating the DAC output signal Vout. Digital input bits D0, D1 are received by the circuit from the digital section of the DAC. A reservoir capacitor Cf is connected between the op-amp output and its inverting input where, in operation, feedback via the capacitor establishes a 'virtual earth' in a well-known manner. Also provided are sample capacitors C0, C1 . . . CN, corresponding in number to the number of data bits D0-DN.

Each of the capacitors C0 to CN has a capacitance value weighted in accordance with the weighting of a corresponding data bit D0 to DN. As explained below, the weighting is not in practice a simple binary sequence 1, 2, 4, 8, 16 . . . $2^N$, but it can be envisaged as such for the purpose of the present description. These element capacitors have one plate connected all together, where they can be connected to the reservoir capacitor and the non-inverting input of op-amp U1 by a switch S1, under control of a switch control signal CS1. On the other plates, each sample capacitor C0 to CN is connectable to the other plate of the reservoir capacitor (OP-AMP output) by a respective switch S2(0) to S2(N). This bank of switches are controlled in unison by a switch control signal CS2 and, for convenience, can be referred to simply as switch S2. The common plates of the sample capacitors can also be connected to the reference voltage Vmid via a switch S3 with control signal CS3. In a physical integrated circuit implementation, the common plates of these particular capacitors will probably be their top plates, to minimize parasitic effects, Such design choices are within the ordinary skill of the person skilled in the art. For the purposes of this description, the plates may be referred to below as 'left' and 'right' referring solely to their orientation in the drawings.

The second plate of sample capacitor C0 can be connected to a reference voltage Vdd or Vss by a switch S4(0), under control of a control signal CS4. Switch S4(0) in fact comprises a set of switches S4a(0) to S4d(0), as seen in FIG. 2b. The value of the corresponding data bit D0 determines which of switches S4a(0) and S4b(0) is closed, while switches S4c(0) and S4d(0) ensure that the path through S4(0) as a whole is closed only in the presence of the switch control signal CS4. Similar arrangements S4(1) to S4(N) are in place to connect the right hand plate of each sample capacitor C0-CN to either Vdd to Vss, according to the state of its respective data bit, when actuated by control signal CS4. Again, the individual switches in this bank can be referred to collectively as switch S4. The structure illustrated in FIG. 2b is only one possible implementation of the S4 function, and other implementations providing the appropriate behavior are equally valid.

All switches except S4(0)-(N) are constructed using transmission gates (comprising NMOS and PMOS devices in parallel). Switches S4(0)-(N) consist in this example of NMOS devices S4b and S4d connected to Vss and PMOS devices S4a and S4c connected to Vdd. In an example where the negative supply voltage Vss is at zero volts, the reference voltage Vmid will typically be Vdd/2. Positive and negative reference voltages Vdd and Vss may be the same as the supply voltages for the circuit as a whole, or may be specially generated reference voltages. Different choices of reference and supply voltages may dictate different choices of transistor and switch implementation, all within the capabilities of the skilled reader.

In operation, the DAC circuit cycles repetitively through a series of phases, of which the two main components are a sampling phase and a transfer phase. In the sample phase, switches S3 and S4 are closed, so that each elemental capacitor C0 to CN gets charged to a voltage representing its particular data bit D0 to DN. Then, in the transfer phase, the switches S1 and S2 are closed, connecting the elemental capacitors in parallel across the reservoir capacitor Cf. Because the amount of charge carried by each sample capacitor is a function of its capacitance as well as its voltage, the total charge available for transfer to the reservoir capacitor is proportional to the value represented by the binary data D0 to DN. This will be explained in more detail below.

In a real implementation, where the DAC circuit shown is part of a larger sigma-delta arrangement, these phases are repeated at a sampling frequency much higher than the sample rate of the incoming digital data. High fidelity audio data might comprise 24 bits per sample at a rate (per channel) of 96 kHz. The DAC switching frequency may be 12.288 MHz, for example to provide 128 times oversampling. As mentioned already, the simple principle of binary weighted capacitor values is modified in a real implementation, and the high sample rate allows various techniques to be used to achieve better performance than crude capacitor weighting would allow. Without going into too much unnecessary detail, rather than directly converting 24-bit input samples to analog at 96 kHz, a practical implementation will actually convert only 6 bits, say, per sample, and use digital pre-processing with noise-shaping, to generate 128 of these 6-bit samples from each 24-bit input sample in such a way as to represent the 24-bit value when averaged over time. All these functions will be controlled by a sequencing control circuit including for example a "shuffler" algorithm to randomise the selection between identical capacitors, thereby spreading any errors in the matching of individual capacitors. Thus it will be understood that different sizes of capacitance should be made by ganging together numbers of identical unit capacitors, rather than trying to make capacitors of widely different areas. For example, to implement a 6-bit conversion, the DAC may include, say, fifteen capacitors (C0-C14) each just 1, 2, 4, or 8 units in size. These are addressed by combinations of the fifteen data signals D0-D14 in accordance with the shuffler algorithm, so that mismatch between individual capacitors is averaged out and the desired precision obtained. Feedback is implemented in the well-known sigma-delta architecture, not described herein.

Figure 3:
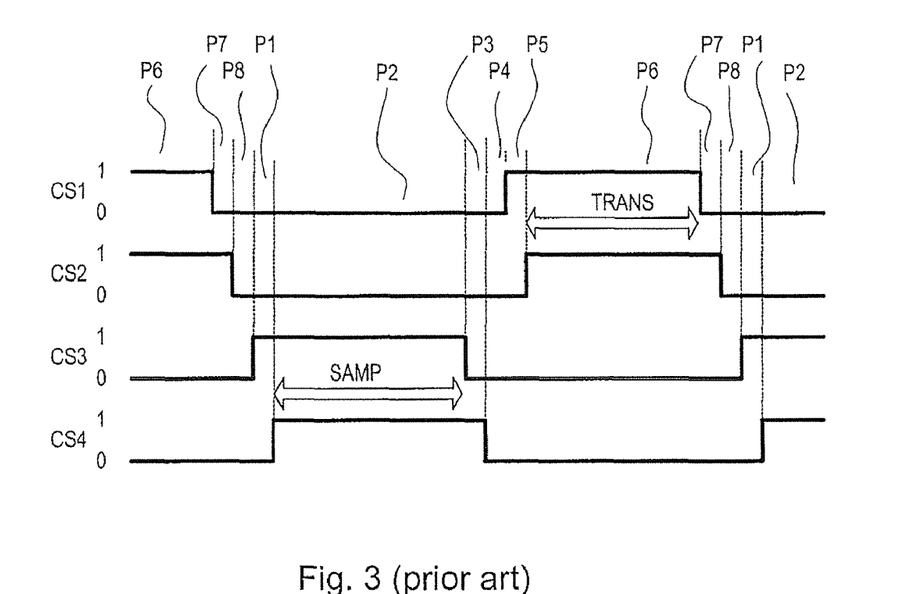
FIG. 3 is a waveform diagram showing the timing of control signals in the circuit of FIG. 2a/2b.

FIG. 3 illustrates the waveforms applied to the switch control inputs CS1-CS4 over one 12.288 MHz period. The waveforms divide the clock period into eight distinct phases, with truth table as shown below. In the table, a '1' causes closure of the controlled switch, while a '0' leaves the switch open. It will be understood that these values are assigned for the sake of explanation, and the exact values of the signals are adapted to the particular design of switch.

| Phase | CS1 | CS2 | CS3 | CS4 | Function |
|-------|-----|-----|-----|-----|----------|
| P1    | 0   | 0   | 1   | 0   |          |
| P2    | 0   | 0   | 1   | 1   | SAMPLE   |
| P3    | 0   | 0   | 0   | 1   |          |
| P4    | 0   | 0   | 0   | 0   |          |
| P5    | 1   | 0   | 0   | 0   |          |

-continued

| Phase | CS1 | CS2 | CS3 | CS4 | Function |
|---|---|---|---|---|---|
| P6 | 1 | 1 | 0 | 0 | TRANSFER |
| P7 | 0 | 1 | 0 | 0 | |
| P8 | 0 | 0 | 0 | 0 | |

In the cycle of operation as explained above, phase P2 represents the sample phase, while phase P6 represents the transfer phase. These two phases are generally equal in length. The intermediate phases (referred to hereinafter as "guard phases") are provided merely to ensure an orderly transition between these phases, for example to prevent leakage of the accurately sampled data, and to prevent short circuits arising where two switches are closed at the same time which shouldn't be. The guard phases are kept short to maximise the settling time in the key phases P2 and P6. The waveform diagram does not show the phases to scale, and the guard phases may be shorter than illustrated, in practice.

As explained already, during the sample phase P2, each data bit D0 to DN will determine whether its corresponding sample capacitor C0 to CN is charged to a positive or negative voltage. In the case where Vss=0V and Vmid=Vdd/2, these voltages will be +Vdd/2 or −Vdd/2. When, in the transfer phase P6, all these sample capacitors are connected across reservoir capacitor Cf, the net total charge which was initially across the array of sample capacitors C0 . . . CN will now be present across the feedback capacitor Cf and the sample capacitor array.

The principle of charge conservation applies in the system and the output voltage Qf/Cf will continue to change during subsequent clock phases until the following occurs:

$$\frac{Qf(SAMP)}{Cf(SAMP)} = \frac{Q0(TRANS) + Q1(TRANS) + \ldots + QN(TRANS) + Qf(TRANS)}{C0(TRANS) + C1(TRANS) + \ldots + CN(TRANS) + Cf(TRANS)}$$

where each Q represents the charge across the corresponding capacitor C in the sample phase (SAMP) or transfer phase (TRANS), as indicated.

Figure 4:
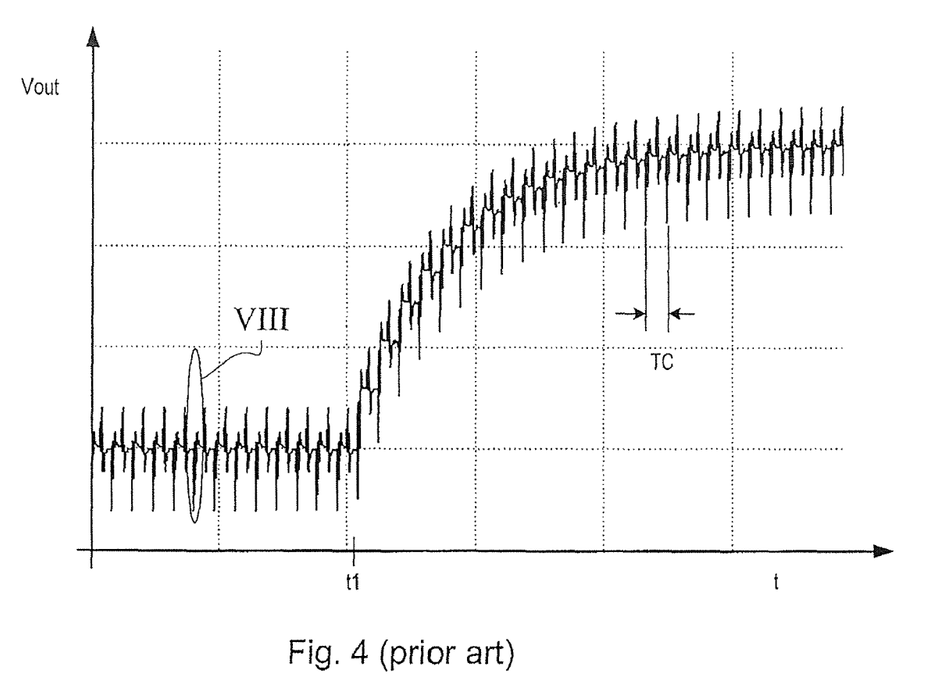
FIG. 4 illustrates the form of output of the switched capacitor DAC, prior to filtering.

FIG. 4 shows an HSPICE simulation result showing a real implementation of such a switched capacitor DAC output settling when the digital input changes from one value to another at time T1. The wanted signal is represented by the underlying ramp shape of the curve shown, while a periodic high frequency pattern can be seen superimposed on the output signal as an artefact of the switched capacitor operation. This high frequency component has a characteristic period TC equal to the switched-capacitor sample rate, that is, a frequency of 12.288 MHz in the present example. The shape of the high-frequency signals will be discussed in more detail below. A low-pass or band-pass filter (not shown) is included between the DAC output and the amplifier input, to remove these high frequency components.

The rate at which the underlying output voltage reaches its new value is the filter response of the switched capacitor filter and is dependent on the ratio of total sample capacitance to reservoir capacitance Cf, and the clocking rate. This rate is designed to deliver the desired frequency response of the DAC system, ideally allowing the signal Vout to ramp from fully negative to fully positive within one 96 kHz data sample period (128 DAC sample periods). The behavior of the circuit in this respect is the same as a simple, analog switched-capacitor integrator, but with the input signal being synthesized from the digital data by selective operation of the switches S4.

Figure 5:
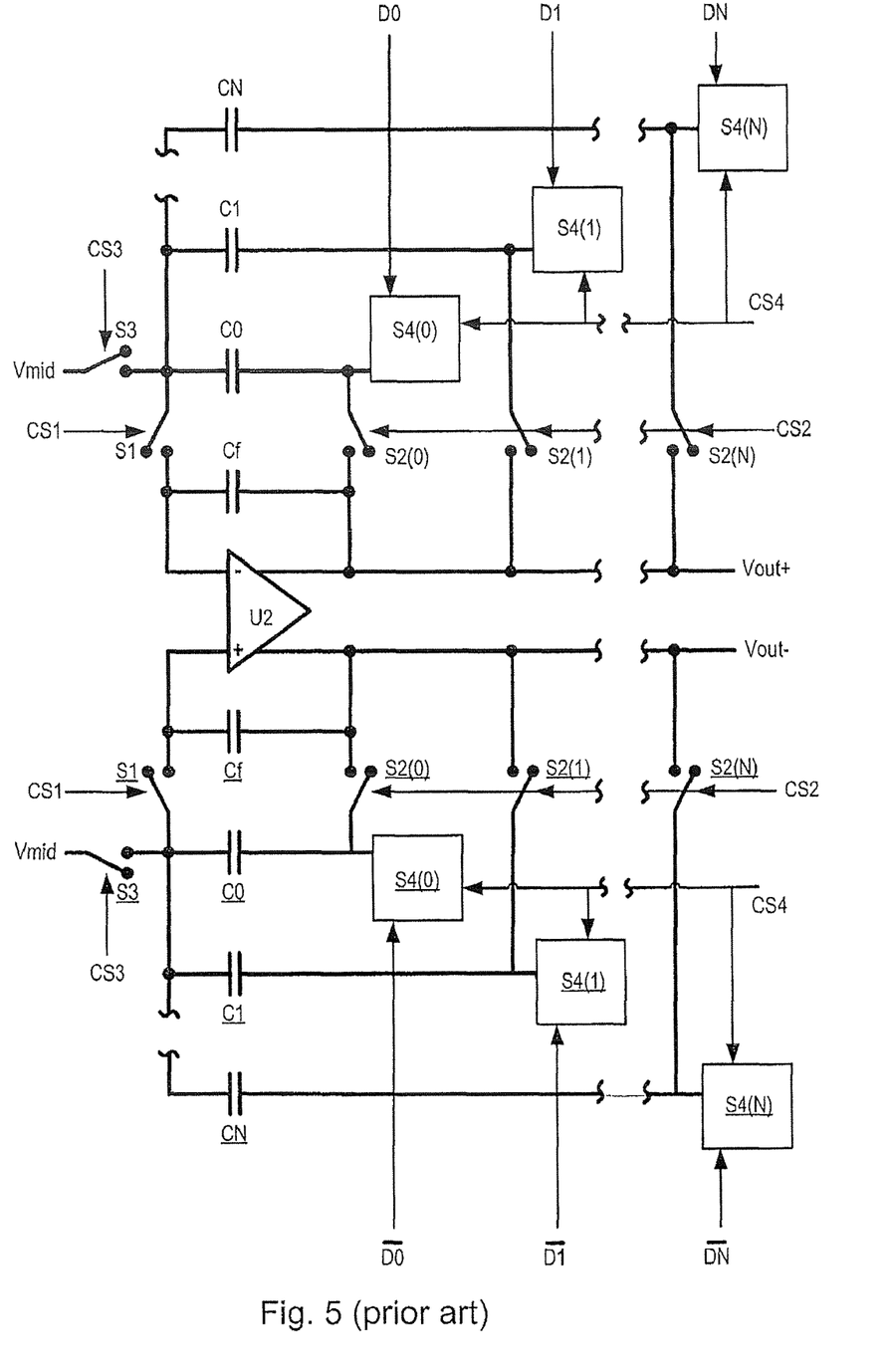
FIG. 5 shows a differential (balanced) version of the DAC circuit of FIG. 2a/2b.

FIG. 5 illustrates a fully differential version of the basic DAC circuit. Op-amp U1 is replaced by an op-amp U2 having differential outputs, to generate a differential (balanced) pair of output signals Vout+ and Vout−. These signals are ideally symmetrical, the audio or other signal being defined as the difference between them. As is well known, a fully differential architecture would normally be chosen for high performance applications, enabling much a better common mode rejection of interfering signals.

As will readily be seen, the circuit is essentially symmetrical also, with a 'positive' half (top half of the diagram) comprising switches and capacitors for generating signal Vout+ and a 'negative' half (bottom half as shown) for generating Vout− in a mirror image of Vout+. The architecture of each half is essentially the same as the single-ended circuit shown in FIG. 2a, with underline being used to distinguish components S1, C0 etc. in the positive side from similar components S1, C0 on the negative side. It will be seen that the digital data D0-DN is inverted before being input to the negative side capacitor array. All other signals are the same. This includes the switch control signals CS1-CS4, so that the switches on both sides operate in unison with their counterpart on the opposite side. A control loop (not shown) is provided to set the common mode voltage and remove common mode error in a known manner.

The skilled reader will realise that the noise contribution of the switching capacitors in such an architecture is proportional to the inverse of the size of the switching capacitors multiplied by the inverse of the frequency at which they are switched. To achieve a high level of performance (low noise) it follows that a significant amount of charge must be moved in a short period of time. This can lead to causes of harmonic distortion, not usually a problem at lower performance points, becoming significant as the designer strives to improve the SNR performance of the DAC.

Figure 6:
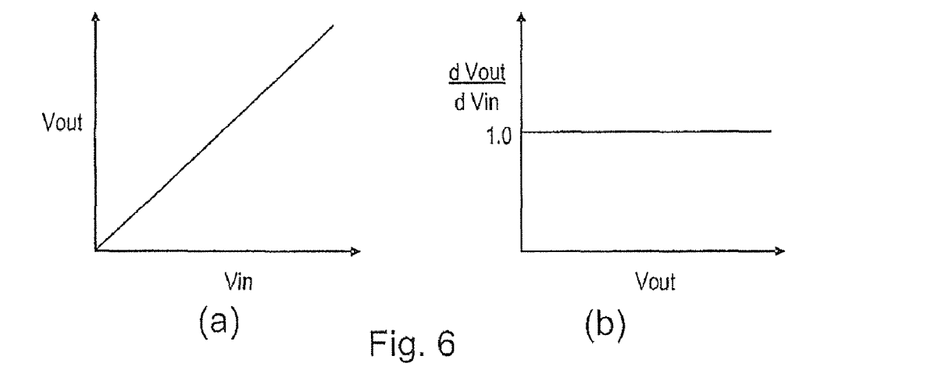
FIGS. 6 and 7 illustrate schematically the correlation between (a) transfer function and (b) gain as a function of output voltage, in an ideal and non-ideal DAC, respectively.
Figure 7:
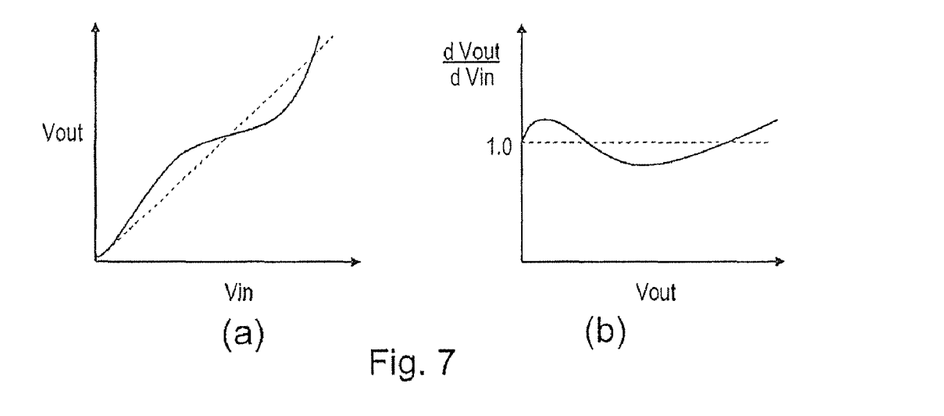

FIGS. 6 and 7 illustrate the concept of non-linearity which is the root cause of harmonic distortion. These are not real traces, merely illustrations of the principle. In each Figure, a circuit's gain versus output voltage (b) is obtained by taking the derivative of the circuit's voltage transfer function (a). For example, if an ideal system has unity gain (dVout/dVin=1) it will have a transfer characteristic and gain plot as shown in FIG. 6(a) and (b), respectively. If a non-linearity is introduced to this system, then these plots may look as shown in FIG. 7(a) and (b). Here it is clearly shown that, if the relationship between Vout and Vin (data in the case of a DAC) is non-linear, then the gain varies about its ideal value as Vout changes. Harmonic distortion will result from such variation, and the derivative of Vout/Vin provides a good "order of merit" analysis tool for comparison or different transfer functions.

It is found that a desire for low noise (measured as high SNR) and low harmonic distortion (measured as low THD) can conflict in designing a practical implementation. For example, SNR is improved by using large capacitors to reduce kT/C noise. A consequence of this is that any MOSFET switches used must be large to ensure a low enough channel resistance to allow for accurate settling, but larger switches, worsen the problem of charge injection (Charge injection is coupling of the control signal from the gate into the drain-source path of a switch transistor.) The higher clock frequencies, desirable for good SNR as already explained, result in the proportion of settling error per clock cycle being higher. Both of these factors will result in a degradation of THD performance. The inventors have analysed the origins of these distortions and devised a solution to a major contributor of it.

The inventors' analysis shows that a significant contribution to distortion is introduced during the transfer phase, when the sampling capacitors are connected in parallel with Cf to the output. For low THD, not only must the resulting output voltage settle to its desired value accurately, any variation of the settling characteristic as a function of the output voltage must be in a linear fashion. This settling characteristic is a function of the feedback capacitors and resistance of switches CS1 and CS2 (provided the op-amp U1 is not slew rate limited, in which case the settling would be dominated by devices within the operational amplifier). The capacitance will remain constant, to first order, for any given device, but this is not true of the switch resistance. The drain to source channel resistance $R_{DS}$ of the switches behaves according to:

$$R_{DS} = \frac{L}{K'W(V_{GS} - V_T)} \quad [2]$$

and their threshold voltage $V_T$ is given by:

$$V_T = V_{T0} + \gamma(\sqrt{2\phi + V_{SB}} - \sqrt{2\phi}) \quad [3]$$

In these equations, K' is a process constant, W and L are the channel width and length, $V_{GS}$ is the gate-source voltage across a transistor, $V_{T0}$ is the threshold voltage extrapolated to absolute zero temperature, γ is the bulk threshold parameter, Θ is the work function of the silicon (another process constant), and $V_{SB}$ is the source-bulk (source-substrate) voltage.

For switch S1 (and S1 in the opposite half of the circuit) it can easily be shown that $R_{DS}$ will remain constant across the range of output voltage. However, the gate-source voltages and bulk-source voltages of the transistors in switch bank S2 are dependent on the output voltage and whether their individual capacitor was charged to a positive or negative voltage in phase P2. Consequently, the drain source resistance of switch S2 will vary in a non-linear fashion across output voltage range. Hence the settling behavior to the desired output voltage will differ across output voltage range, and harmonic distortion is introduced.

The problem is compounded by the fact that each switch (except S4) is a transmission gate realised using a PMOS and NMOS devices in parallel. For the fully differential structure shown in FIG. 5, if Vout+ is a high voltage, Vout+ settling will be dominated by PMOS switch impedance. Conversely, at the same time point Vout− settling will be dominated by NMOS switch impedance. Even though various steps are taken to make these resistances match as well as possible, the matching is never going to be perfect, hence differential non-linearity is introduced.

Figure 8:
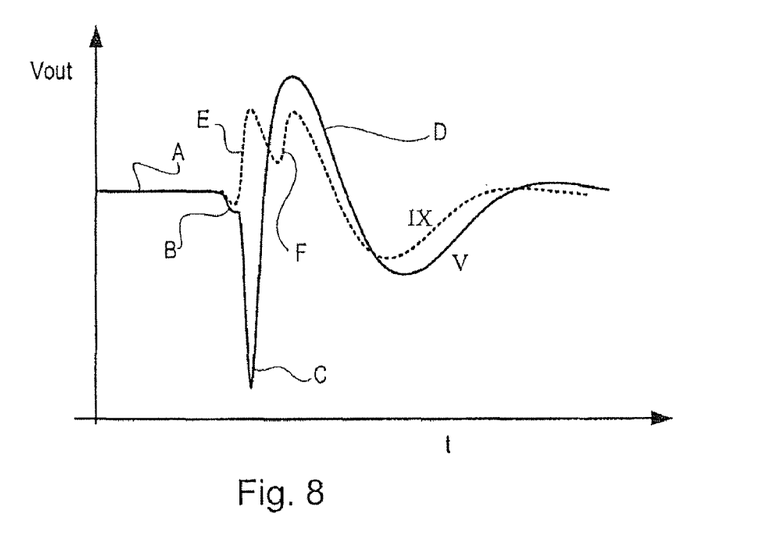
FIG. 8 illustrates in more detail a charge transfer transient occurring in the output waveform of FIG. 4, with an improved charge transfer transient overlaid for comparison.

FIG. 8 (solid curve V) shows enlarged detail of the HSPICE simulation result of FIG. 4, showing the transfer phase transient in Vout which has been found to be responsible for dominant THD degradation in the circuit of FIG. 5. Key features have been labelled A, B, C, D. Initially at A the curve is flat. A first transient component B is caused by the switch S1 closing, connecting the common plates of the sample capacitors to the virtual earth created at the op-amp input. The error associated with this transition remains constant across DAC output voltage range, therefore differentially no harmonic distortion is introduced. The second transient C is caused by switch bank S2(0) . . . S2(N) closing, and the subsequent ringing D is a result of the operational amplifier settling.

The characteristics of this transient C depends partly on the impedance of each switch in the S2(0) to S2(N). Since this impedance varies with the individual voltage as shown above in Equations (2) and (3), the contributions of the transient C to the output signal has non-linear components, causing harmonic distortion.

Figure 9:
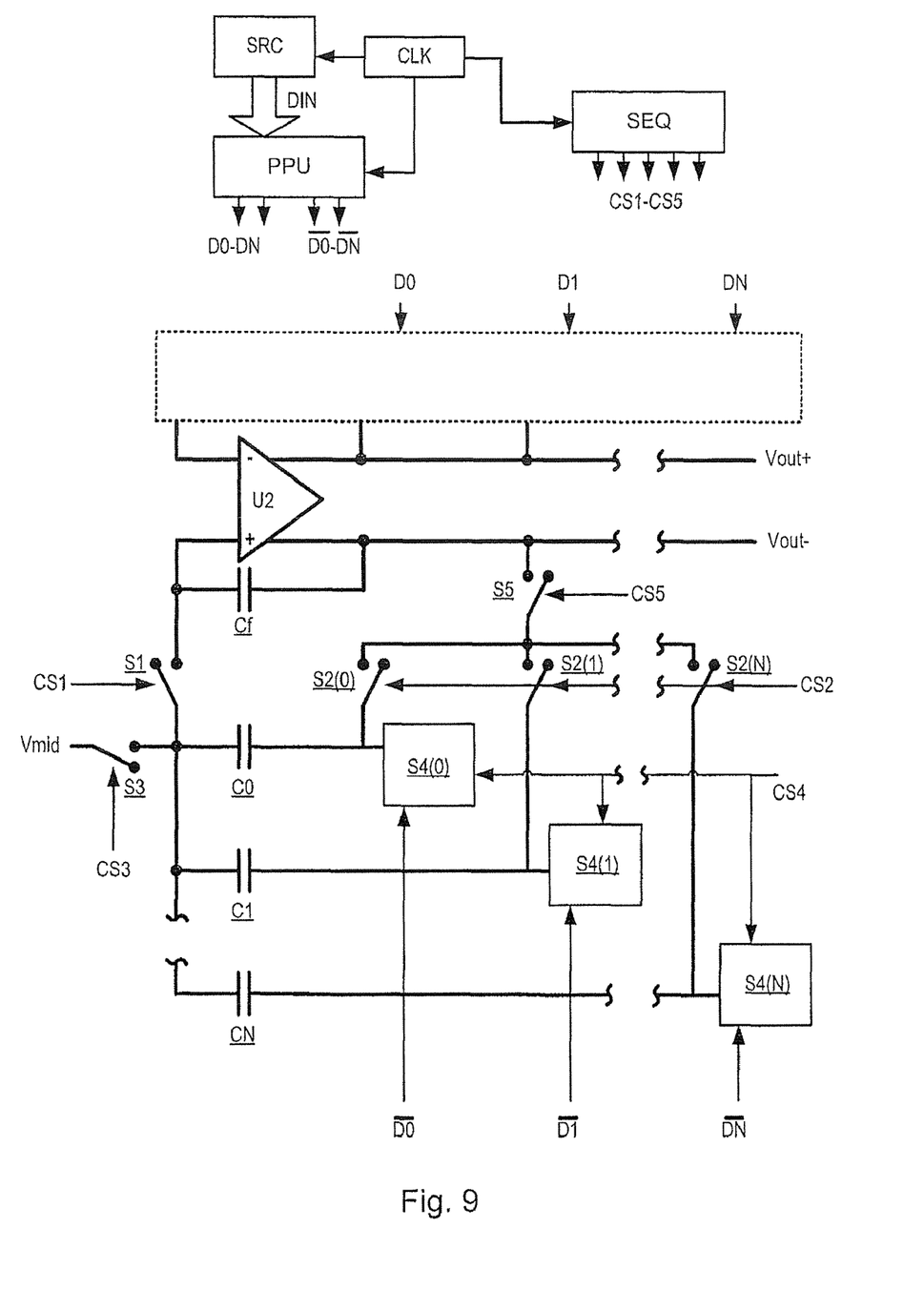
FIG. 9 illustrates the architecture of a novel switched capacitor DAC according to one embodiment of the present invention.

FIG. 9 shows a modified switched capacitor DAC circuit, in which the non-linear transient can be masked from the output until the voltage across the sample capacitors has settled. By this step, the inventors have appreciated that the settling non-linearity, and hence THD, will be significantly reduced. For reasons of space, the upper half of the circuit is represented by a dotted box, 900. The circuit is substantially identical to that of FIG. 5, but with the addition of an extra switch S5 between the reservoir capacitor Cf and the S2 switch bank, controlled by an extra control signal CS5. Switches S5 and S5 are naturally provided in the top and bottom halves of the circuit, though only the bottom half is shown in detail.

FIG. 9 also shows for completeness the control and pre-processing elements that would generally form part of the DAC and associated apparatus. The digital data source SRC is shown, providing the input digital data DIN, which may be 24-bit, 96 kHz as described. A pre-processing block PPU converts these to the digital data bits D0-DN appropriate to drive each half of the switched capacitor DAC circuit, with a 12.288 MHz sample frequency as discussed already above. Sequencer block SEQ generates the switch control signals CS1 to CS5. A clock generator CLK ensures these elements are synchronized, and may contain PLL and DLL circuits appropriate to drive the higher frequency clocks and multi-phase clock signals needed for the digital to analog conversion from the source sample rate or other source. Note that these control and sequencing elements may be shared between plural DAC channels, for example where stereo or multi-channel (surround) audio signals are being converted.

Figure 10:
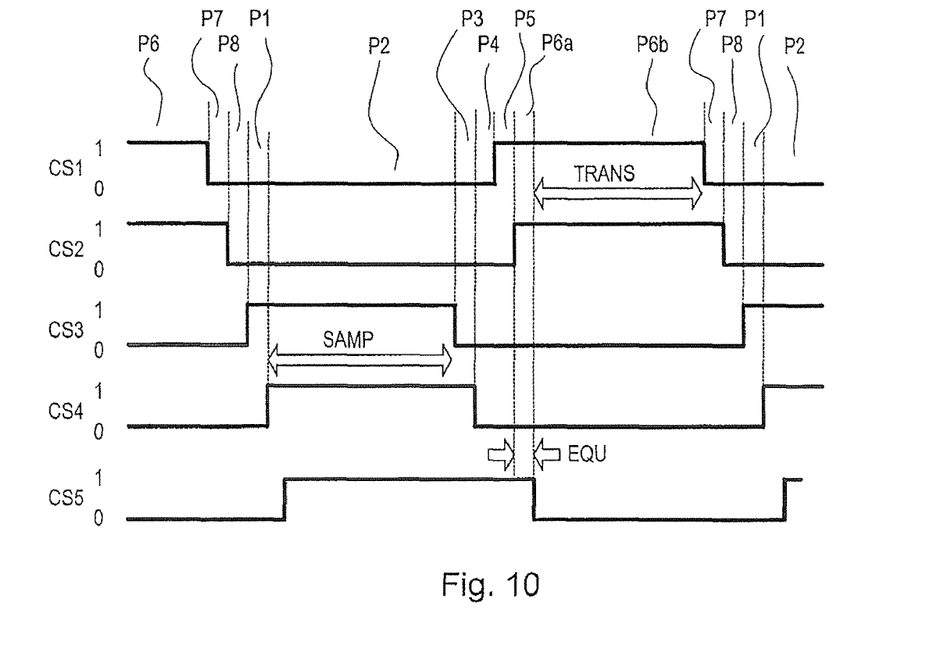
FIG. 10 is a waveform diagram illustrating switch control signals in operation of the circular FIG. 9.

FIG. 10 shows the waveforms CS1-CS5 by which the modified DAC operates, and the table below shows the truth table for the switch control signals in nine distinct phases. Again, '1' indicates switch closed and '0' indicates switch open. It will be seen that the phases in this sequence are the same as those of the known design, but the transfer phase that was phase P6 has now been split in to a pre-transfer "equalization" phase P6a and a transfer phase P6b.

Thus, when switch bank S2 is closed, masking switch S5 remains open for a short time, perhaps $\frac{1}{10}$ of a half period. This allows the right hand plates of all the sample capacitors C0-CN to settle to a common value, hence the name 'equalization'. Switch S5 is then closed, connecting this settled array of capacitors across the reservoir capacitor Cf. Switch S5 can in principle open again at the same time as switch S2. For ease of generating the signal CS5, however, there is no harm in the signal staying high through one or more subsequent phases, as shown in the waveform diagram of FIG. 10, hence the 'don't care' states indicated by 'X' in the state table.

| Phase | CS1 | CS2 | CS3 | CS4 | CS5 | Function |
|-------|-----|-----|-----|-----|-----|----------|
| P1    | 0   | 0   | 1   | 0   | X   |          |
| P2    | 0   | 0   | 1   | 1   | 0   | SAMPLE   |
| P3    | 0   | 0   | 0   | 1   | 0   |          |
| P4    | 0   | 0   | 0   | 0   | 0   |          |

-continued

| Phase | CS1 | CS2 | CS3 | CS4 | CS5 | Function |
|-------|-----|-----|-----|-----|-----|----------|
| P5    | 1   | 0   | 0   | 0   | 0   |          |
| P6a   | 1   | 1   | 0   | 0   | 0   | EQUALIZATION |
| P6b   | 1   | 1   | 0   | 0   | 1   | TRANSFER |
| P7    | 1   | 0   | 0   | 0   | X   |          |
| P8    | 0   | 0   | 0   | 0   | X   |          |

Simulations show that the resulting settling error at the output is significantly reduced as there is a much smaller voltage difference across the final output switch, S5, as it is closed. More importantly, the new transient behavior is much more linear across output voltage than was apparent in the conventional architecture.

Referring again to FIG. 8, we see in dotted curve IX detail of one transition in the output waveform of the modified circuit of FIG. 9. This can be compared with the solid curve V for the FIG. 5 circuit. The first transient component B is still present, caused as before by the switch S1 closing. Rather than seeing a large spike C followed by a period D of ringing when the switches S2 are closed, the modified waveform exhibits two separate events: one at E when the switches S2 close but are masked from Vout by the open switch S5, and a later one at F, when the masking switch S5 closes. Between these two events, the various charges across the sample capacitors C0-CN equalize, and the transient F is smaller as a result of the equalized value being closer to the existing value of Vout than the individual sample capacitor values, which each will be fully '0' or '1'.

It is important to note that the effect of these transients on Vout depends on the area under the curve, rather than the amplitude of any particular spike. More importantly, the magnitude of the transients does not in itself determine their contribution to the problem of harmonic distortion, What is important is the extent to which the effect of these transients is non-linear with respect to Vout. By splitting the transfer step into two, with the pre-transfer equalization step, the transients in the output signal of the novel circuit show much better linearity than in the prior art. One reason for this is that the difference between the equalized value and the existing output value will generally be quite small, so that the variations of switch resistance with voltage, represented in Equations 2 and 3 above, do not come so much into play.

Figure 11:
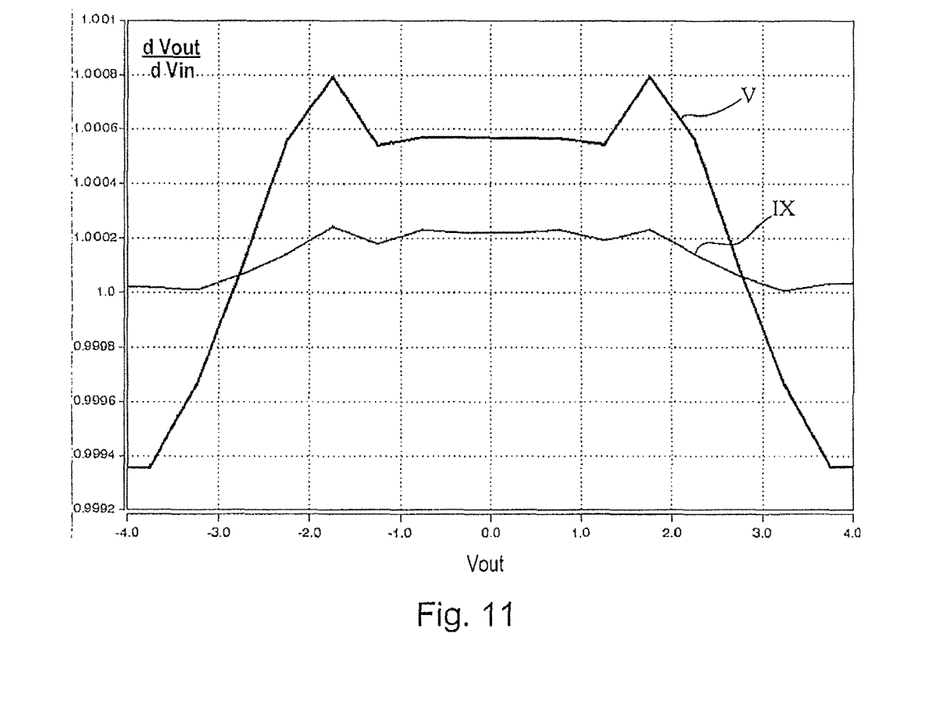
FIG. 11 is a gain plot obtained by simulation of (V) the DAC of FIG. 5 and (IX) FIGS. 9 and 10.

FIG. 11 is a gain plot produced by HSPICE simulation, showing a comparison of gain error between (IX) the FIG. 9 structure and (V) the FIG. 5 structure, as the differential output voltage (Vout=Vout+−Vout−) varies from −4 to +4 volts. Clearly the variation in gain across the output range is greatly reduced, leading to a corresponding improvement in linearity of the system and consequently a reduction in harmonic distortion.

Various refinements in the implementation are desirable to gain full benefit from the reduction of this source of error. These are not novel in themselves, but each becomes useful as other, larger sources of distortion and/or noise are eliminated, so they will be mentioned here for completeness.

One of these concerns output switch sizing. It is important that the individual S2 switches are matched with one another for impedance. In a differential implementation, depending on the polarity of the signal at a given time, an NMOS transistor active in the upper (Vout+) half of the circuit will be complemented by a PMOS transistor doing the corresponding action in the lower half. Channel resistance for each transmission gate will vary as a function of output voltage (single ended), because of the different properties of the transistors. It is desirable to have as symmetrical a response as possible so that Vout+ and Vout− experience the same settling behavior up to the point where switch S5 is closed. This reduces differential error and hence improves THD performance. The W/L ratio for the PMOS device will therefore be roughly 3 times that of the NMOS device (the exact value determined depending on process). Dummy devices are placed at each side of the 'real' NMOS device in each switch S2, to minimize charge injection from the clock control signals.

Due to the fact that the switching frequency of the DAC is much faster than the audio signal being reproduced, the maximum change in output voltage per clock period and, therefore, the voltage across masking switch S5 before it closes will be small (in the order of millivolts). As a result, it is less important to match the S5 PMOS and NMOS devices for equal impedance. They can therefore be sized to minimize charge injection from the clock control signals, and W/L of the PMOS device need not be larger than W/L of the NMOS device.

Variations discussed above in relation to the known circuits of FIGS. 2 to 5 can be applied equally in the novel circuits. The reference voltages Vdd and Vss are assumed in the above examples to be the same as the supply voltages for the circuitry generally, and supplied from the same source. This need not be the case, however. Separate reference sources can be provided if desired, and the reference sources for the positive and negative halves of the circuit may be separate, if desired.

The invention is compatible with various other techniques to improve performance and these can be incorporated in the novel DAC, as desired, without detracting from the principles of the present invention. Particular techniques are known for example from U.S. Pat. No. 7,102,557 (Frith), U.S. Pat. No. 6,952,176 (Frith & Pennock) and U.S. Pat. No. 6,573,850 (Pennock). The '557 patent discloses additional switches to allow the sampling capacitors (C0 etc. in our description) to be connected with either polarity between positive and negative reference voltages, rather than between a positive or negative reference voltage and a mid reference voltage as described above. The '850 patent discloses resetting each element capacitor to a neutral voltage prior to each new sampling phase. This removes a source of non-linearity in the load which the circuit places on the reference sources (Vdd, Vss in the above examples), and so eliminates another source of harmonic distortion. Among the 1-bit and multi-bit DAC examples described in U.S. Pat. No. 6,573,850 (Pennock), the multi-bit versions shown in FIGS. 8 to 10 of that patent are the ones pertinent to the present invention. The Pennock technique involves additional states and thereby further shortens the sample and transfer phases, however, so it may not be attractive to combine it with the novel technique in some applications. US'176 discloses a differential switched-capacitor DAC (that is, one having differential outputs each driven by upper and lower portions of the circuit) in which additional switches permit each sampling capacitor to be connected alternately to reference sources in the opposite portions of the circuit, thereby balancing signal-dependent loading between those reference sources.

The skilled reader will appreciate that the above and other modifications and additions are possible to these circuits, without departing from the spirit and scope of the invention as defined in the appended claims. Accordingly, the above described embodiments are presented to illustrate rather than limit the scope of the invention. For interpreting this specification and claims, the reader should note that the word "comprising" does not exclude the presence of elements or steps other than those listed in a claim, the singular article "a" or "an" does not exclude a plurality, and a single element may fulfill the functions of several elements recited in the claims. Any reference signs in the claims shall not be construed so as to limit their scope.

Where a claim recites that elements are "connected" or are "for connecting", this is not to be interpreted as requiring direct connection to the exclusion of any other element, but rather connection sufficient to enable those elements to function as described. The skilled reader will appreciate that a good, practical design might include many auxiliary components not mentioned here, some of which have been mentioned already, and none of which detract from the basic functions characteristic of the invention in its various embodiments described above in the claims.

In addition to variations and modifications within the DAC circuit itself, the invention encompasses all manner of apparatuses and systems incorporating the DAC, besides the Hi-Fi amplifier application illustrated in FIG. 1. The circuit may be used to generate analog signals in all manner of apparatus, including communications apparatus, where the output stage may drive an antenna or transmission line, an electro-optical transducer (light emitting device) or electromechanical transducer. In all these fields of application, the addition of the pre-transfer equalization phase can be used to reduce harmonic distortion, and/or relax constraints on other aspects of the design without increasing harmonic distortion unacceptably.

What is claimed is:

1. A digital to analog converter circuit (DAC) having inputs for a plurality of digital data bits and at least one output for an analog signal, the DAC comprising:
    a first capacitor for accumulating charge representing the desired analog output signal;
    an amplifier for generating said analog signal in response to voltage on said first capacitor;
    an array of further capacitors corresponding in number at least to the number of said data bits; and
    a network of switches operable in a first state which connects at least a subset of said further capacitors to sources of reference voltage selected in accordance with values of said data bits, in a second state which connects said further capacitors in parallel with one another without connecting them in parallel with the first capacitor and in a third state which connects said further capacitors in parallel with one another and to said first capacitor.

2. A DAC as claimed in claim 1 further comprising:
    a sequencer for controlling said switches to implement repeatedly a cycle of said first, second and third states in that order.

3. A DAC as claimed in claim 2 wherein said sequencer is arranged to make said first and third states last at least twice as long as said second state.

4. A DAC as claimed in claim 2 wherein said sequencer is arranged to control said switches to implement a guard states of short duration in the course of transitions between said first and third states, said further capacitors being isolated from both reference voltages and said first capacitor during said guard state.

5. A DAC as claimed in claim 1 wherein each of said further capacitors has a first terminal and a second terminal.

6. A DAC as claimed in claim 5 wherein each of said further capacitors has, its first terminal being connected to a first common node, and said network of switches includes switches operable to connect said common node in said first state to a reference voltage and in said third state to a first terminal of said first capacitor.

7. A DAC as claimed in claim 5 wherein said network of switches comprises an array of switches operable to connect the second terminals of said further capacitors to a (second) common node, and a further switch connected between said common node and a (second) terminal of said first capacitor.

8. A DAC as claimed in claim 7 wherein said further switch comprises a transmission gate in which a PMOS transistor is not more than twice the area of an NMOS transistor in the same transmission gate.

9. A DAC as claimed in claim 1 wherein each switch of said network comprises at least one MOS transistor.

10. A DAC as claimed in claim 9 wherein some switches of said network comprise MOS transmission gates made of both NMOS and PMOS transistors while other switches comprise only NMOS or only PMOS transistors.

11. A DAC as claimed in claim 10 wherein the PMOS transistor of at least one of said transmission gates has approximately three times the area of the NMOS transistor, and dummy NMOS transistors are provided to equalize gate area on the PMOS and NMOS transistors.

12. A DAC as claimed in claim 1 further comprising a duplicate set of capacitors and switch network for generating a complementary analog output signal from complementary digital data bits representing the negative of the value represented by said digital data bits, the two analog signals in use forming a differential output signal.

13. A DAC as claimed in claim 1 further comprising pre-processing means for receiving a sequence of input digital data samples at an input sample rate and for generating intermediate digital data samples comprising said digital data bits at a higher sample rate.

14. A DAC as claimed in claim 13, wherein said intermediate digital data samples have fewer bits than said input digital data samples.

15. A DAC as claimed in claim 13 further comprising a low pass filter having a cut-off frequency between the input sample rate and that of the intermediate digital data.

16. An integrated circuit product comprising a DAC circuit as claimed in claim 1 together with a decoder for deriving said data bits from stored signal data.

17. An integrated circuit product as claimed in claim 16 wherein said decoder is for audio data and two or more DACs are provided to generate analog output signals for respective audio channels in said digital audio data.

18. Digital audio apparatus comprising a source of digital audio data, a switched capacitor digital to analog converter as claimed in claim 1 and an analog audio amplifier, the amplifier being connected to be driven by an analog signal generated by said DAC in response to said digital audio data.

19. Apparatus as claimed in claim 18 wherein said source of digital audio data comprises a reader for digital audio data stored in a storage medium.

20. A method of converting plural bits of digital data into an analog output signal, the method comprising:
    providing a first capacitor for accumulating charge representing the desired analog output signal;
    providing an array of further capacitors corresponding in number at least to the number of said data bits;
    selectively interconnecting said capacitors with one another and with reference voltage sources in a repetitive sequence of phases including (i) a first phase in which said further capacitors are connected to reference voltages selected in accordance with the values of said data bits so as to accumulate samples of charge representing values of said digital data bits, (ii) an equalization phase in which said further capacitors are connected in parallel with one another without connecting them in parallel with the first capacitor, followed by (iii) a transfer phase in which the parallel connected further capacitors are connected in parallel with the first capacitor; and generating said analog signal in response to voltage on said first capacitor.

21. A method as claimed in claim 20 wherein said selective interconnection is performed using a network of switches and a sequencer for controlling said switches to implement repeatedly a cycle of said sample, equalization and transfer phases, in that order.

22. A method as claimed in claim 21 wherein said sample and transfer phases each last at least twice as long as said equalization phase.

23. A method as claimed in claim 21 wherein said repetitive sequence of phases further includes guard states of short duration in the course of transitions to and from said sample phase, said further capacitors being isolated from any reference voltage and from said first capacitor during said guard state.

24. A method as claimed in claim 20 wherein each of said further capacitors has a first terminal and a second terminal.

25. A method as claimed in claim 24 wherein each of said further capacitors has its first terminal connected to a first common node, and switches are provided to connect said common node in said sample phase to a reference voltage and in said transfer phase to the first terminal of said first capacitor.

26. A method as claimed in claim 24 wherein an array of switches are used to connect the second terminals of said further capacitors to a (second) common node in said equalization and transfer phases, and a further switch is used to connect said (second) common node to a (second) terminal of said first capacitor to implement said transfer phase.

27. A method as claimed in claim 26 wherein said further switch comprises a transmission gate in which a PMOS transistor is not more than twice the area of an NMOS transistor in the same transmission gate.

28. A method as claimed in claim 20 further comprising providing a duplicate set of capacitors and generating a complementary analog output signal from complementary digital data bits representing the negative of the value represented by said digital data bits, the two analog signals in use forming a differential output signal.

29. A method as claimed in claim 20 further comprising:
receiving a sequence of input digital data samples at an input sample rate; and
pre-processing said input digital samples to generate intermediate digital data samples at a higher sample rate, said intermediate digital data samples defining said digital data bits for the digital to analog conversion.

30. A method as claimed in claim 29, wherein said intermediate digital data samples have fewer bits than said input digital data samples.

31. A method as claimed in claim 29 further comprising:
filtering the analog output signal with having a low-pass cut-off frequency between the input sample rate and that of the intermediate digital data.

32. A method as claimed in claim 20 further comprising:
decoding said data bits from stored signal data.

33. A method as claimed in claim 32 wherein said data is audio data and two or more streams of digital data are converted by said method to generate analog output signals for respective audio channels in said digital audio data.

* * * * *